US006204551B1

(12) United States Patent
Lin

(10) Patent No.: US 6,204,551 B1
(45) Date of Patent: Mar. 20, 2001

(54) MODIFIED SOG COATER'S HOT PLATE TO IMPROVE SOG FILM QUALITY

(75) Inventor: Chi-Fa Lin, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/376,660

(22) Filed: Aug. 16, 1999

(51) Int. Cl.$^7$ .................................................... H01L 23/58
(52) U.S. Cl. ........................................... 257/650; 118/668
(58) Field of Search .................................. 257/634, 650, 257/647, 644, 646, 637, 641; 438/471, 474, 477, 660; 118/668

(56) References Cited

U.S. PATENT DOCUMENTS 5,565,034 * 10/1996 Nanbu et al. ........................ 118/668
5,686,143 * 11/1997 Matsukawa et al. ................ 427/271

* cited by examiner

Primary Examiner—Matthew Smith
Assistant Examiner—Calvin Lee
(74) Attorney, Agent, or Firm—W. Wayne Liauh

(57) ABSTRACT

A heating assembly for use in semiconductor fabrication processes to evaporate solvent contained in a liquefied spin-on-glass (SOG) layer so as cause the SOG layer to solidify. The heating assembly contains: (a) a hot plate and a loader robot to transport a semiconductor wafer to a surface of the hot plate; (b) a plurality of through holes formed in the hot plate; (c) a plurality of movable support columns traveling through the through holes to support the semiconductor wafer and allow the semiconductor wafer to descend in a controlled manner; and (d) a controller to control a descending speed of the plurality of movable support columns. By carefully controlling the descending speed of the liquefied SOG-containing wafer, the formation of micro-cracks can be eliminated, thus resulting in improved yield rate.

10 Claims, 2 Drawing Sheets

MODIFIED SOG COATER'S HOT PLATE TO IMPROVE SOG FILM QUALITY

FIELD OF THE INVENTION

The present invention relates to an improved device for fabricating semiconductor devices. More specifically, the present invention relates to an improved semiconductor fabricating device which includes a hot plate for baking an SOG (spin-on-glass) coated wafer so as to evaporate the solvent contained in the SOG coating. One of the main advantages of the SOG coating device of the present invention is that it can effectively prevent the problem associated with the formation of micro-cracks in the solidified SOG film, thus improving the yield rate during the fabrication of ultra-large-scale integrated (ULSI) circuits, without requiring major capital investment nor the need for substantial modifications of the SOG coating device or process.

BACKGROUND OF THE INVENTION

In the fabrication of ultra-large scale-integration (ULSI) circuits, vertical stacking, or integration, of metal wiring circuits to form multilevel interconnection has recently become a common approach to increase circuit performance and increase the functional complexity of the circuits. One drawback of multilevel interconnection is the loss of topological planarity resulting from various photolithographic and etching processes. To alleviate these problems, the wafer is planarized at various stages in the fabrication process to minimize non-planar topography and thus its adverse effects. One of the first steps in the planarization process is to coat a liquefied dielectric material, such as silicon dioxide, on the surface of the wafer, using the so-called spin-on-glass (SOG) process, by which a coating machine is used to spin the wafer while the liquefied silicon dioxide is being applied onto the wafer. After the SOG process, the wafer is placed on top of a hot plate, so as to evaporate the solvent contained in the SOG layer so as to solidify the SOG layer. Other non-glass material, typically a polymer material, can be used in forming such SOG layer.

FIGS. 1A and 1B show the top view and side view, respectively, of a conventional hot plate used in conjunction with an SOG coater. After the wafer 1 is SOG coated, it is placed on top of a loader robot 2 which moves along the tracks 3 formed in the hot plate 4. After the loader robot 2 moves the SOG-coated wafer 1 to the predetermined place, it then drops the wafer 1 onto the surface of the hot plate 4, where the solvent contained in the liquefied SOG layer is evaporated to form a solidified SOG layer.

Because of the ever-increasing consumer demand and expectation for better and cheaper IC products, a semiconductor manufacturer must look at every possible avenue to increase production yield rate so as to reduce the overall product cost. After having carefully examined a large number of production failures, the inventor of the present invention discovered that one of the common types of failures was related to micro-cracks that occurred in the solidified SOG layer and which can be visualized from a scanning electronic microscope. Because an SOG layer is typically required in each vertical integration, the possibility of failure due to a damaged SOG layer multiplies in today's high density IC chips. At the present time, this problem has not be identified, nor has any solution been proposed, by the semiconductor industry.

SUMMARY OF THE INVENTION

The primary object of the present invention is to develop an improved semiconductor fabrication device so as to reduce the production yield failure rate. More specifically, the primary object of the present invention is to modify appropriate portions of a semiconductor fabrication device, without involving major capital expense or substantially affecting the fabricating process, so as to eliminate or at least minimize the formation of micro-cracks in the solidified SOG layer, and thus eliminate one possible cause of production yield failure in the fabrication of ULSI semiconductor devices.

After extensive research and investigations, the inventor has discovered that the formation of micro-cracks in the solidified SOG layer can be attributed to the unsteady state heat transfer problem that takes place during the baking of the liquefied SOG layer to evaporate solvent contained therein. More specifically, the inventor of the present invention discovered that the conventional wafer loader robots are designed primarily for one-dimensional movement. As a result, the wafer is very rapidly placed on the hot plate, causing the exterior portion of the liquefied SOG layer to solidify before its interior portion has an opportunity to experience an adequate temperature rise. The solvent entrapped within the solidified SOG "shell" can prolong the heating process thus increasing the extent of thermal stress which can tend to cause the SOG layer to form cracks. But, more importantly, the relatively large volume change associated with the phase change (solidification) of the liquefied SOG inside the solidified SOG shell can cause large thermal and mechanical stress to be exerted on the already solidified SOG layer and cause it to develop micro-cracks.

After the cause of the micro-crack problem is identified, an apparent solution is to modify the baking (i.e., solidification) step to cause it to gradually lower the wafer onto the hot plate so as not to subject the liquefied SOG layer to a sudden heating condition. However, the conventional loader robot is, relatively speaking, very bulky, it would be difficult and quite expensive to provide a mechanism which can precisely control the movement of the loader robot in a second direction, i.e., in the vertical direction which is perpendicular to the movement of the loader robot.

In the present invention, the SOG coater hot plate is modified such that a plurality of controllable support columns are provided beneath and through the hot plate. After the loader robot transports the wafer to the predetermined place, the controllable support columns will take over and allow the wafer to be gradually lowered onto the hot plate. By not subjecting the wafer to a sudden heat as in the conventional process, the liquefied SOG layer solidifies in a controlled and more uniform manner. Unexpectedly superior results were observed from the present invention in that the modified SOG coater hot plate seems to have eliminated the cause of micro-crack formation in the solidified SOG layer.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved semiconductor fabrication equipment to reduce yield failure rate; it modifies appropriate portions of a commercial semiconductor fabrication equipment, so as to eliminate or at least minimize the formation of micro-cracks in the solidified SOG layer, and thus eliminate one possible cause of production yield failure in the fabrication of ULSI semiconductor devices. One of the main advantages of the present invention is that, these benefits can be achieved without incurring major capital expenses or substantially affecting the fabricating process.

The inventor has discovered, after extensive research, that the formation of micro-cracks in the solidified SOG layer can be attributed to an uneven unsteady state heat transfer problem which occurs during the baking of the liquefied SOG layer. As discussed previously, the inventor of the present invention discovered that the problem of micro-crack formation can be related to the design of the conventional wafer loader robots which are intended primarily for one-dimensional movement. As a result, the wafer is essentially instantly placed on the hot plate after the loader robot reaches its intended position, causing the exterior portion of the liquefied SOG layer to solidify before its interior portion experiences adequate temperature rise, thus forming a "shell"-like structure of the SOG layer. The solvent entrapped within the solidified SOG "shell" can prolong the heating process thus increasing amount of heat provided to the SOG layer, as well as the extent of thermal stress which can tend to cause the SOG layer to form cracks. But, as discussed earlier, a more severe problem is that the relatively large volume change associated with the phase change (from liquid to solid) of the liquefied SOG inside the solidified SOG shell can exert significant thermal and mechanical stresses on the already solidified SOG layer and cause micro-cracks to be developed.

Figure 1A:
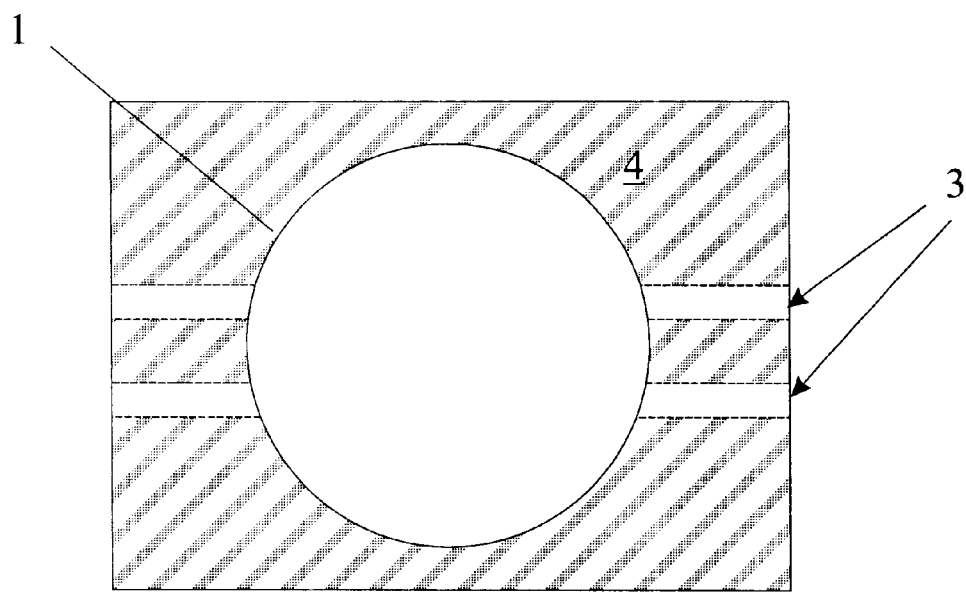
FIG. 1A is a schematic top view showing the conventional SOG coater hot plate.
Figure 1B:
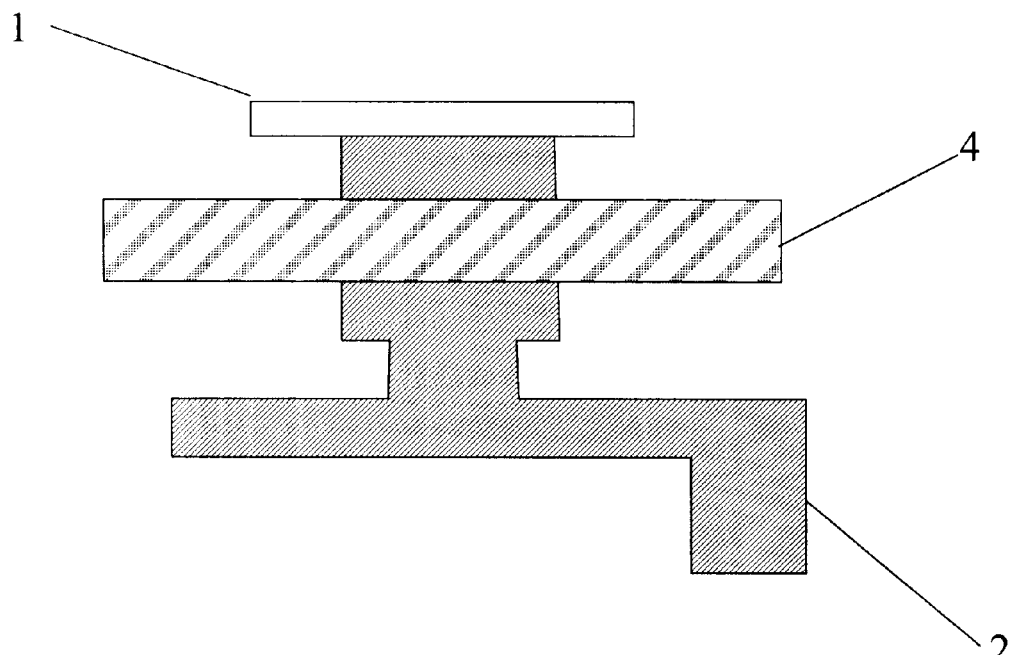
FIG. 1B is a schematic side view showing the conventional SOG coater hot plate with a loader robot.

FIGS. 1A and 1B show the top view and side view, respectively, of a conventional hot plate used in conjunction with an SOG coater. After the wafer 1 is SOG coated, it is placed on top of a loader robot 2 which moves along the tracks 3 formed in the hot plate 4. After the loader robot 2 moves the SOG-coated wafer 1 to the predetermined place, it then drops the wafer 1 onto the surface of the hot plate 4, where the solvent contained in the liquefied SOG layer is evaporated to form a solidified SOG layer. In order to provide adequate sturdiness, the loader robot is, relatively speaking, constructed to be in very bulky manner. It proves to be very impractical and quite expensive to provide a mechanism which can precisely control the movement of the loader robot in a second direction, i.e., in the vertical direction which is perpendicular to the movement of the loader robot.

In the present invention, the SOG coater hot plate is modified to contain a plurality of through holes and a corresponding plurality of controllable support columns are provided beneath the hot plate which can move up and down through the through holes. After the loader robot transports the wafer to the predetermined place, the controllable support columns will take over and gradually lower the wafer onto the hot plate in a precisely controlled manner. By not subjecting the wafer to a sudden heat as in the conventional process, the liquefied SOG layer solidifies in a better controlled and more uniform manner. Unexpectedly superior results were observed in that the modified SOG coater hot plate seems to have eliminated the cause of micro-crack formation in the solidified SOG layer.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

Example 1

Figure 2A:
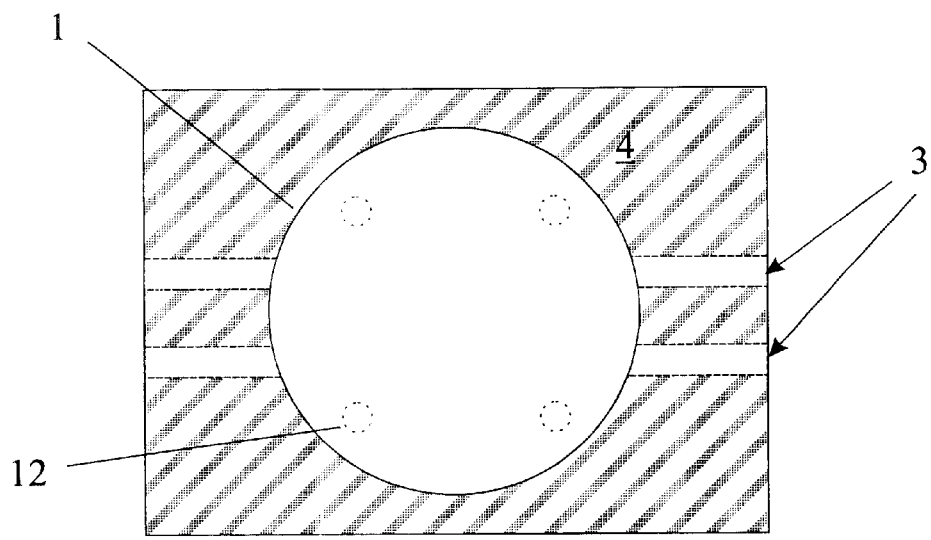
FIG. 2A is a schematic top view showing the improved SOG coater hot plate according to a preferred embodiment of the present invention.
Figure 2B:
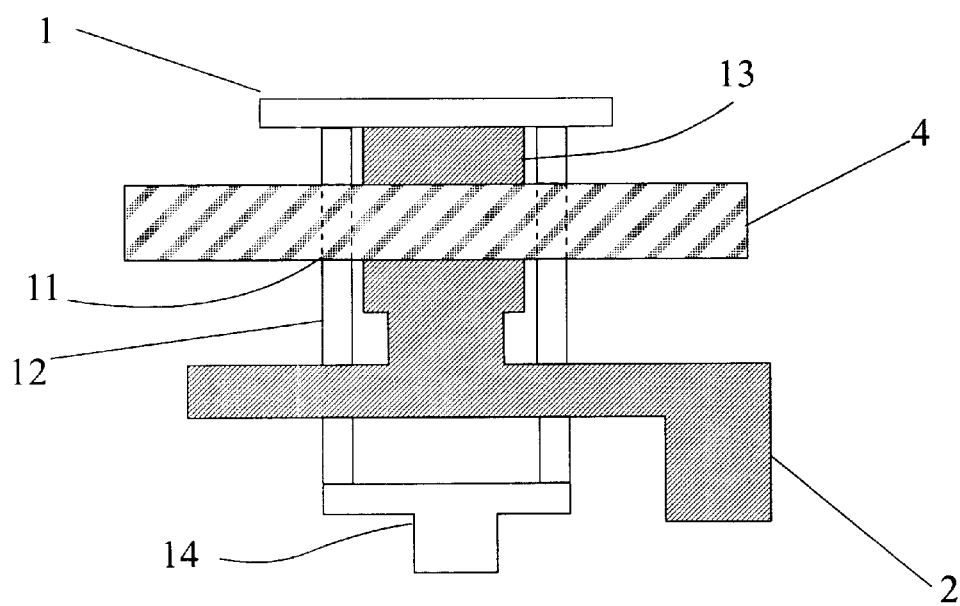
FIG. 2B is a schematic side view showing the improved SOG coater hot plate according to a preferred embodiment of the present invention with a loader robot and four riser columns.

FIG. 2A is a schematic top view showing the improved SOG coater hot plate according to a preferred embodiment of the present invention and FIG. 2B is a schematic side view showing the improved SOG coater hot plate according to a preferred embodiment of the present invention with a loader robot and four riser columns. Similar to the conventional coater hot plate, the SOG-coated wafer 1 is placed on top of a loader robot 2 which contains a pair of vertically disposed plates 13 to support the wafer 1 and move along the pair of tracks 3 formed in the hot plate 4. However, with the present invention, after the loader robot 2 moves the SOG-coated wafer 1 to the predetermined place, the plurality of controllable support columns 11 which are provided beneath the hot plate and penetrate through the through holes 12 take over the support. A controller 14 is provided to control the ascending and descending speeds of the controllable support columns 11. The controllable support columns are computer controlled so that they can gradually lower the wafer onto the hot plate onto the surface of the hot plate 4, where the solvent contained in the liquefied SOG layer is evaporated to form a solidified SOG layer. By preventing the SOG-coated wafer from exposing to a sudden heat as in the conventional process, the liquefied SOG layer solidifies in a better controlled and more uniform manner. No micro-cracks were observed in the solidified SOG layer.

Optionally, a temperature sensor can be attached to the hot plate, and the measured temperature data is sent to the controller to adjust the ascending speed of the support columns.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A semiconductor fabrication device containing a heating assembly, said heating assembly comprising:
   (a) a hot plate and a loader robot to transport a semiconductor wafer to a surface of said hot plate;
   (b) a plurality of through holes formed in said hot plate;
   (c) a plurality of movable support columns traveling through said through holes to support the semiconductor wafer and allow the semiconductor wafer to descend in a controlled manner; and
   (d) a controller to control a descending speed of said plurality of movable support columns.

2. The semiconductor fabrication device according to claim 1 wherein said loader robot contains a plurality of vertically disposed plates to support the wafer and travel along a corresponding plurality of tracks formed in said hot plate.

3. The semiconductor fabrication device according to claim 1 wherein said loader robot is designed to move only horizontally.

4. The semiconductor fabrication device according to claim 1 wherein said heating assembly is designed to vaporize liquefied spin-on-glass contained on the semiconductor wafer.

5. The semiconductor fabrication device according to claim 1 wherein said controller comprises a temperature sensing member to monitor a temperature of said hot plate so as to adjust a descending speed of said movable support columns.

6. A heating assembly for use in semiconductor fabrication processes, said heating assembly comprising:

(a) a hot plate and a loader robot to transport a semiconductor wafer to a surface of said hot plate;

(b) a plurality of through holes formed in said hot plate;

(c) a plurality of movable support columns traveling through said through holes to support the semiconductor wafer and allow the semiconductor wafer to descend in a controlled manner; and (d) a controller to control a descending speed of said plurality of movable support columns.

7. The heating assembly for use in semiconductor fabrication processes according to claim 6 wherein said loader robot contains a plurality of vertically disposed plates to support the wafer and travel along a corresponding plurality of tracks formed in said hot plate.

8. The heating assembly for use in semiconductor fabrication processes according to claim 6 wherein said loader robot is designed to move only horizontally.

9. The heating assembly for use in semiconductor fabrication processes according to claim 6 wherein said heating assembly is designed to vaporize liquefied spin-on-glass contained on the semiconductor wafer.

10. The heating assembly for use in semiconductor fabrication processes according to claim 6 wherein said controller comprises a temperature sensing member to monitor a temperature of said hot plate so as to adjust a descending speed of said movable support columns.

* * * * *